(12) United States Patent
Schreivogel (10) Patent No.: US 11,041,897 B2
(45) Date of Patent: Jun. 22, 2021

(54) CAPACITIVE STRUCTURE AND METHOD FOR DETERMINING AN AMOUNT OF CHARGE USING THE CAPACITIVE STRUCTURE

(71) Applicant: Robert Bosch GmbH, Stuttgart (DE)

(72) Inventor: Martin Schreivogel, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 140 days.

(21) Appl. No.: 15/755,588

(22) PCT Filed: Aug. 29, 2016

(86) PCT No.: PCT/EP2016/070278
§ 371 (c)(1),
(2) Date: Feb. 27, 2018

(87) PCT Pub. No.: WO2017/037000
PCT Pub. Date: Mar. 9, 2017

(65) Prior Publication Data
US 2019/0033357 A1   Jan. 31, 2019

(30) Foreign Application Priority Data

Sep. 4, 2015   (DE) ...................... 10 2015 216 997.9

(51) Int. Cl.
*G01R 29/24*   (2006.01)
*H01G 7/06*   (2006.01)
(Continued)

(52) U.S. Cl.
CPC ........... *G01R 29/24* (2013.01); *H01G 4/1245* (2013.01); *H01G 7/06* (2013.01); *G01D 5/2405* (2013.01)

(58) Field of Classification Search
CPC .................................................. G01R 29/24
See application file for complete search history.

(56) References Cited

U.S. PATENT DOCUMENTS 6,414,318 B1 * 7/2002 Uber, III ............ G01R 19/2509
250/250
6,614,051 B1   9/2003 Ma
(Continued)

FOREIGN PATENT DOCUMENTS

CN   101002361 A   7/2007
CN   101859644 A   10/2010
(Continued)

OTHER PUBLICATIONS

International Search Report corresponding to PCT Application No. PCT/EP2016/070278, dated Nov. 17, 2016 (German and English language document) (5 pages).

*Primary Examiner* — Son T Le
*Assistant Examiner* — Adam S Clarke
(74) *Attorney, Agent, or Firm* — Maginot, Moore & Beck LLP (57) ABSTRACT

A method for determining an amount of charge uses a capacitive structure which has an electrode device, a dielectric material with a voltage-dependent permittivity, and a counter-electrode device. The method has an adjusting step, an applying step, and a detecting step. In the adjusting step, an electric reference potential is adjusted between the electrode device and the counter-electrode device in order to adjust a reference capacity. In the applying step, an electrical potential resulting from the amount of charge is applied in addition to the reference potential in order to obtain a resulting capacity. In the detecting step, a capacity change is detected between the reference capacity and the resulting capacity in order to determine the amount of charge.

13 Claims, 4 Drawing Sheets

(51) Int. Cl.
*H01G 4/12* (2006.01)
*G01D 5/24* (2006.01)

(56) References Cited

U.S. PATENT DOCUMENTS

| | | | |
|---|---|---|---|
| 2006/0049834 A1* | 3/2006 | Umeda | G01D 5/24 |
| | | | 324/658 |
| 2006/0186901 A1* | 8/2006 | Itakura | G01N 27/223 |
| | | | 324/689 |
| 2007/0089513 A1 | 4/2007 | Rosenau et al. | |
| 2008/0049375 A1 | 2/2008 | Lee | |
| 2009/0246933 A1* | 10/2009 | Deguet | H01L 21/76254 |
| | | | 438/455 |
| 2013/0257456 A1 | 10/2013 | Liu et al. | |
| 2015/0126836 A1* | 5/2015 | Fennell | A61B 5/0004 |
| | | | 600/347 |
| 2015/0198558 A1* | 7/2015 | Schreivogel | G01N 27/419 |
| | | | 204/412 |
| 2019/0049498 A1* | 2/2019 | Mori | G01R 27/2605 |

FOREIGN PATENT DOCUMENTS

| | | |
|---|---|---|
| DE | 33 13 417 A1 | 10/1984 |
| DE | 10 2014 200 481 A1 | 7/2015 |
| GB | 2 430 752 A | 4/2007 |

* cited by examiner

CAPACITIVE STRUCTURE AND METHOD FOR DETERMINING AN AMOUNT OF CHARGE USING THE CAPACITIVE STRUCTURE

This application is a 35 U.S.C. § 371 National Stage Application of PCT/EP2016/070278, filed on Aug. 29, 2016, which claims the benefit of priority to Serial No. DE 10 2015 216 997.9, filed on Sep. 4, 2015 in Germany, the disclosures of which are incorporated herein by reference in their entirety.

BACKGROUND

The disclosure is based on a device or a method of the type described in the independent claims. The subject matter of the disclosure is also a computer program.

The measurement of amounts of charge is a widespread problem in many electronic applications.

SUMMARY

Against this background, the approach presented here relates to a capacitive structure, a method for producing a capacitive structure, a method for determining an amount of charge by using the capacitive structure, and in addition, a device that uses this method, a system for determining an amount of charge and, finally, a corresponding computer program in accordance with the main claims. The measures given in the dependent claims enable advantageous extensions and improvements to the device specified in the independent claim.

In a capacitor with a voltage-dependent capacitance, a change in the capacitance can be used to determine an amount of charge. To this end, a known operating point and/or a reference capacitance of the capacitor can be adjusted. The amount of charge then changes the capacitance of the capacitor based on the operating point. The change in the capacitance can be detected rapidly, simply and with a high degree of accuracy using known methods.

A capacitive structure is presented which has an electrode device, a dielectric material with a voltage-dependent permittivity, and a counter-electrode device. The dielectric material can be arranged between the electrode device and the counter-electrode device so that the electrode device and the counter-electrode device are arranged on opposite sides of the dielectric. Alternatively, the electrode device and the counter-electrode device can be embedded in the dielectric on the same side of the dielectric material, or the dielectric may be arranged only in a space between the electrode devices that are lying in a plane. In addition, the electrode devices can be introduced into a substrate, for example, by doping, and a dielectric can be deposited in turn.

A capacitive structure can be understood to mean an electrical capacitor.

Furthermore, a method for producing a capacitive structure is presented, wherein the method has the following steps:
provision of an electrode device;
deposition of a dielectric material with a voltage-dependent permittivity on the electrode device; and
deposition of a counter-electrode on the dielectric.

Alternatively, the dielectric can be provided, for example, and the electrode device and the counter-electrode device can be arranged on the dielectric.

Therefore, in a general form the method for producing the capacitive structure can comprise the steps of provision of an electrode device, provision of a counter-electrode device, provision of a dielectric material with a voltage-dependent permittivity, and a step of arranging the dielectric material adjacent to the electrode device and the counter-electrode device.

In addition, a method for determining an amount of charge by using a capacitive structure in accordance with the approach presented here is presented, wherein the method has the following steps:

Adjustment of an electrical reference potential between the electrode device and the counter-electrode device, in order to adjust a reference capacitance;

Application of an electrical potential resulting from the amount of charge in addition to the reference potential in order to obtain a resulting capacitance; and Detection of a change in capacitance between the reference capacitance and the resulting capacitance, in order to determine the amount of charge.

This method can be implemented, for example, in software or hardware or in a combination of software and hardware, for example, in a control unit.

A reference potential can be understood to mean an electrical reference voltage. A resulting potential can be an electrical voltage. During the application of the electrical potential resulting from the amount of charge, i.e., the application of the amount of charge to be measured, in addition to the reference potential a voltage source for setting the reference potential can be disconnected from the capacitive structure.

The electrode device can have an electrode. The counter-electrode device can have a counter-electrode. By means of individual electrodes on both sides of the dielectric, the capacitive structure can be easily produced.

The reference potential between the electrode of the electrode device and the counter-electrode of the counter-electrode device can be adjusted. The electric potential can be applied between the electrode and the counter-electrode. The device can be switched between the reference potential and the potential.

The electrode device can comprise a first partial electrode and a further partial electrode. The first partial electrode and the further partial electrode can be arranged adjacent to one another and electrically insulated from one another. The counter-electrode device can comprise a partial counter-electrode and a further partial counter-electrode. The partial counter-electrode and the further partial counter-electrode can be arranged adjacent to one another and electrically insulated from one another. A spatial separation of the partial electrodes and the partial counter-electrodes enables a simple circuit to be used for operating the capacitive structure.

The reference potential can be adjusted between the electrode of the electrode device and the partial counter-electrode of the counter-electrode device. The electric potential can be applied between the further partial electrode of the electrode device and the further partial counter-electrode of the counter-electrode device. Due to the isolated partial electrodes and partial counter-electrodes, the reference potential and the potential can be applied at the same time. As a result, the reference potential can be changed without affecting the potential.

The dielectric material can be a lead zirconate titanate (PZT). Alternatively, the dielectric can be a barium (strontium) titanate (B(S)T). Using the materials presented here enables a high sensitivity to be achieved. The dielectric material can be implemented as a strained thin film.

At least one further thin film can be arranged between the electrode device and the counter-electrode device. By using the additional thin film, the electrical and/or mechanical properties of the capacitive structure can be positively influenced.

According to one embodiment, the capacitive structure is used as a potential sensor or charge sensor. To achieve this, different calibration methods can be used. The changes measured due to a specific amount of charge depend strongly on the electrode configuration.

The approach presented here also creates a device that is designed to carry out, to control and/or implement the steps of an alternative design of a method presented here in corresponding devices. Also, by means of this design variant of the disclosure in the form of a device, the underlying object of the disclosure can be achieved quickly and efficiently.

A device can be understood in the present case to mean an electrical device, which processes sensor signals and outputs control and/or data signals depending on them. The device can have an interface, which can be implemented in hardware and/or software. In the case of a hardware-based design, the interfaces can be, for example, part of a so-called system-ASIC, which includes the wide range of functions of the device. It is also possible, however, that the interfaces are dedicated integrated circuits, or at least in part consist of discrete components. In the case of a software-based design, the interfaces can be software modules which exist, for example, on a micro-controller in addition to other software modules.

A system for determining an amount of charge is presented, wherein the system comprises a capacitive structure in accordance with the approach presented here, and a device for determining an amount of charge using the capacitive structure in accordance with the approach presented here.

Also advantageous is a computer program product or computer program with program code, which can be stored on a machine-readable medium or storage medium, such as a semiconductor memory, a hard drive or an optical storage device and is used to carry out, implement and/or control the steps of the method according to any one of the embodiments described above, in particular when the program product or program is executed on a computer or a device.

BRIEF DESCRIPTION OF THE DRAWINGS

Exemplary embodiments of the disclosure are shown in the drawings and explained in more detail in the following description. Shown are.

DETAILED DESCRIPTION

In the following description of advantageous exemplary embodiments of the disclosure, identical or similar reference numerals are used for elements shown in the various figures which have similar functions, wherein no repeated description of these elements is given.

Figure 1:
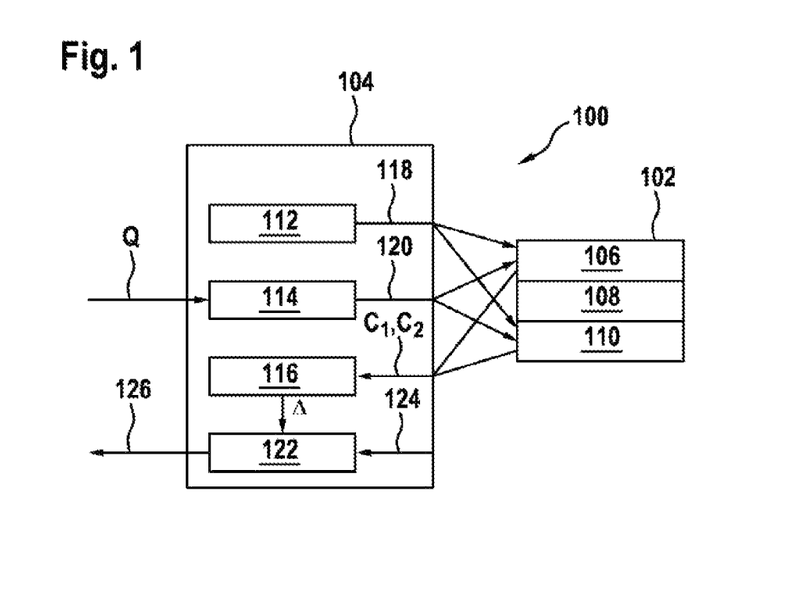
FIG. 1 a block circuit diagram of a system for determining an amount of charge in accordance with an exemplary embodiment.

FIG. 1 shows a block circuit diagram of a system 100 for determining an amount of charge Q in accordance with an exemplary embodiment. The system 100 comprises a capacitive structure 102 and a device 104 for determining the amount of charge Q by using the capacitive structure 102. The capacitive structure 102 and the device 104 are electrically connected to each other. The capacitive structure 102 consists of an electrode device 106, a dielectric material 108 and a counter-electrode device 110. The dielectric material 108 according to this exemplary embodiment is arranged between the electrode device 106 and the counter-electrode device 110 so that a stack-like design is obtained. Alternatively, all electrodes 106, 110 can be arranged on one side of the dielectric material 108. As a general rule, as many field lines as possible between the individual electrode devices 106, 110 should pass through the dielectric material 108. The dielectric 108 has a voltage-dependent dielectric permittivity. The capacitive structure can be designated as a measuring capacitor 102.

The device 104 comprises an adjustment device 112, an application device 114 and a detection device 116. The adjustment device 112 is designed to adjust a reference potential 118 between the electrode device 106 and the counter-electrode device 110 in order to adjust a reference capacitance $C_1$. The application device 114 is designed to apply an electrical potential 120 resulting from the amount of charge Q in addition to the reference potential 118 between the electrode device 106 and the counter-electrode device 110 in order to obtain a resulting capacitance $C_2$. The detection device 116 is designed to detect the reference capacitance $C_1$ and the resulting capacitance $C_2$ and to determine a capacitance change $\Delta C$.

In one exemplary embodiment the device 104 comprises a determination device 122. The determination device 122 is designed to determine a value 126 for the amount of charge Q using the change in capacitance $\Delta C$ and a relation 124 between the electrical potential and the electrical capacitance.

The described approach enables a charge measurement with ferroelectric thin films 108 as the dielectric material 108.

The measurement of amounts of charge Q is a common task in many electronic applications. Examples are the reading of CCD chips, photodetectors, and other sensors. If a high level of accuracy is required, the required resolution of the corresponding transducers increases greatly, and the components (ASICs) are complex and expensive. Conventionally, a charge Q can be determined by charging a fixed, known capacitance and discretizing the applied voltage with an AD-converter with high resolution.

Figure 6:
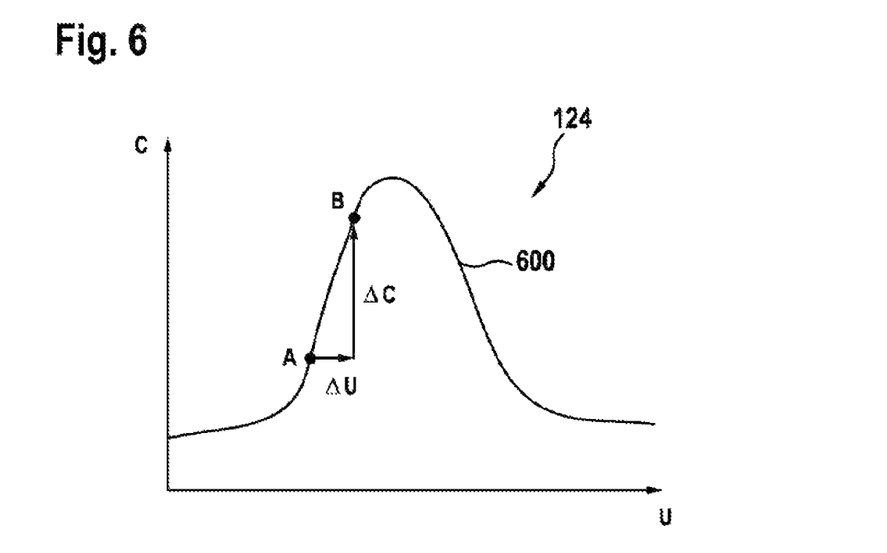
FIG. 6 an illustration of a relationship between an electrical voltage and an electrical capacitance on a capacitive structure in accordance with an exemplary embodiment.

Ferroelectrics 108 can be used in integrated components, such as Ferroelectric Random Access Memory, FRAM. The materials are characterized by a strongly voltage-dependent permittivity, as shown in FIG. 6.

The extremely sensitive, dynamic measurement of capacitances C in the range of attofarads, aF, is a standard technology in the field of micro-mechanical sensors.

The approach presented here enables a highly accurate measurement of an amount of charge Q.

Ferroelectrics 108 and other materials, such as oxides with mobile ions, change their permittivity as a function of the applied field. As a result, capacitors 102, in which such materials are used as dielectrics 108, change their capacitance C in a voltage-dependent manner. If structures 102 of this kind are charged by a charge current Q to be measured, this leads to a change in capacitance ΔC. The change in capacitance ΔC can be evaluated very accurately.

For example, the change in capacitance ΔC can be determined in a technically simple manner by high-resolution capacitance measurements, such as by measuring the frequency detuning of an oscillating resonant circuit in which the capacitance is integrated.

By means of the measurement principle proposed here, costs and installation space can be saved in a large number of applications, for example, sensor-based applications.

Figure 2:
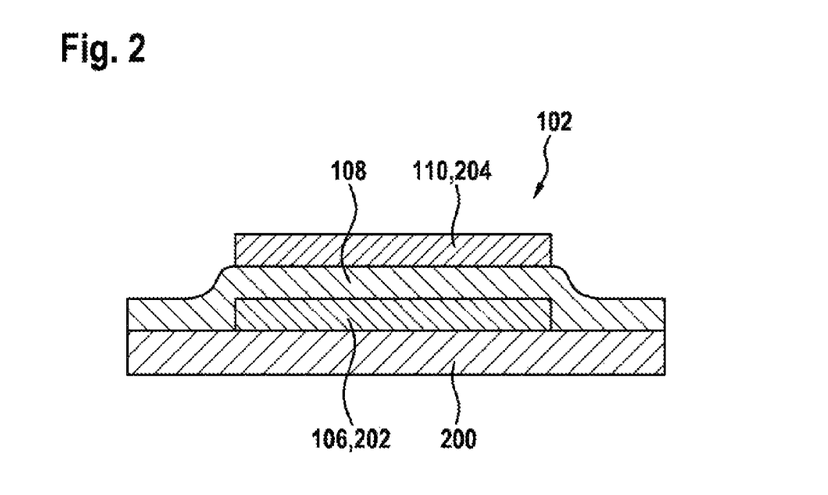
FIG. 2 a sectional view of a capacitive structure in accordance with an exemplary embodiment.

FIG. 2 shows a sectional view of a capacitive structure in accordance with an exemplary embodiment. The capacitive structure 102 is essentially the same as the capacitive structure in FIG. 1. In contrast, the capacitive structure 102 here is applied on a carrier material 200 or substrate 200. One electrode 202 of the electrode device 106 is arranged on the substrate 200. The dielectric 108 is arranged on the electrode 202 and the substrate 200. The polarizable dielectric 108 or ferroelectric 108 has an essentially uniform layer thickness. A counter-electrode 204 of the counter-electrode device 110 is arranged on the dielectric 108. The electrode 202 and the counter-electrode 204 are spaced apart and electrically insulated from each other by the dielectric 108.

Figure 3:
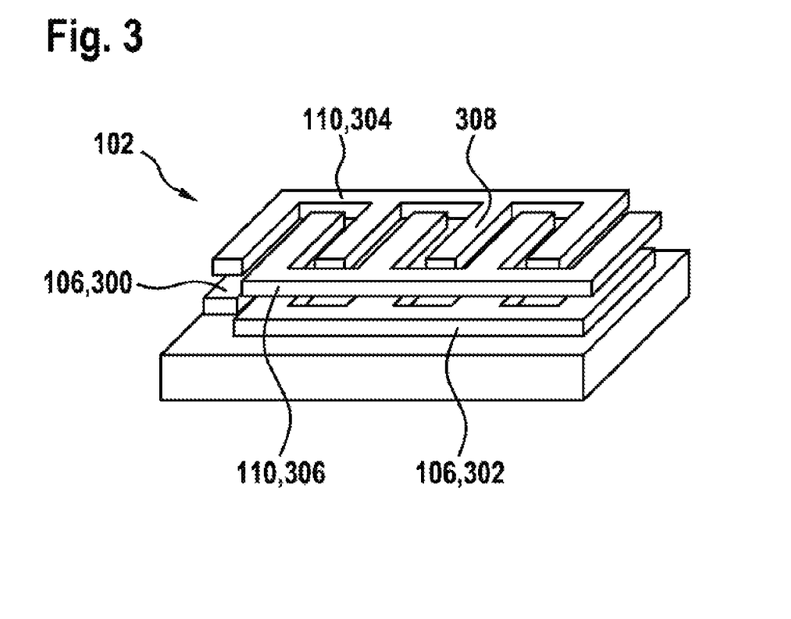
FIG. 3 a spatial view of a capacitive structure in accordance with an exemplary embodiment.

FIG. 3 shows a spatial view of a capacitive structure 102 in accordance with an exemplary embodiment. The capacitive structure 102 is essentially the same as the capacitive structure in FIG. 2. Here, the dielectric 106 is shown transparent. In contrast to the electrode device in FIG. 2, the electrode device 106 here has a first partial electrode 300 and a second partial electrode 302. The two electrodes 300, 302 are electrically insulated from each other. The partial electrodes 300, 302 each have four finger-like tines that are interlaced with each other, wherein the partial electrodes 300, 302 are spaced apart from each other by an intervening gap. The partial electrodes 300, 302 can be designated as interdigital electrodes 300, 302.

The counter-electrode device 110 here has a first partial counter-electrode 304 and a second partial counter-electrode 306. The partial counter-electrodes 304, 306 also have four finger-like tines 308 that are interlaced with each other, wherein the partial counter-electrodes 304, 306 are also spaced apart from each other by an intervening gap. The partial counter-electrodes 304, 306 can be used as interdigital counter electrodes 304, 306.

In the illustrated exemplary embodiment, the partial electrodes 300, 302 and the partial counter-electrodes 304, 306 are of similar design and have essentially identical dimensions. The partial electrodes 300, 302 and the partial counter-electrodes 304, 306 here are aligned in the same way, so that the tines 308 are essentially in congruence. In other words, one of the tines of the first electrode 300 is in each case arranged opposite to one of the tines 308 of the first partial counter-electrode 304. Each one of the tines of the second partial electrode 302 is arranged opposite to one of the tines 308 of the second partial counter-electrode 306.

In one exemplary embodiment, in determining the amount of charge the first partial electrode 300 and the first partial counter-electrode 304 can be charged using the reference potential and the amount of charge to be measured. The second partial electrode 302 and the second partial counter-electrode 306 can be used to measure the capacitance and adjust the operating point (reference capacitance) of the capacitive structure 102. This means the second partial electrode 302 and the second partial counter-electrode 306 can be designated as measuring electrodes 302, 306.

Figure 4:
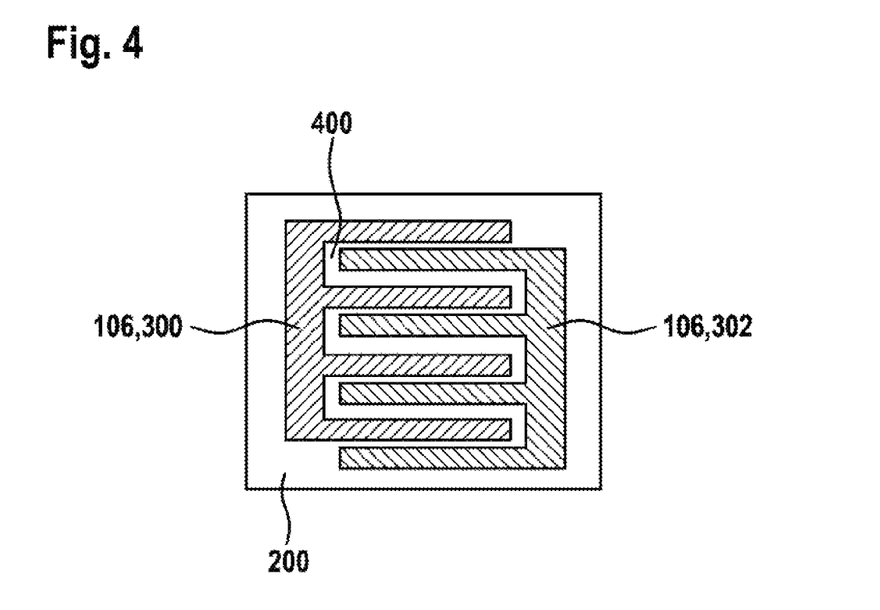
FIG. 4 a representation of an electrode device provided for a capacitive structure according to an exemplary embodiment.

FIG. 4 shows a representation of an electrode device 106 that is provided for a capacitive structure according to an exemplary embodiment. In this case the electrode device 106 is arranged on the substrate 200, as shown in FIGS. 2 and 3. The electrode device 106 has, as shown in FIG. 3, a first partial electrode 300 and a second partial electrode 302, interlaced with the first partial electrode 300. A gap 400 exists between the partial electrodes 300, 302. The gap 400 has a rectangularly meandering shape and insulates the partial electrodes 300, 302 from each other.

Figure 5:
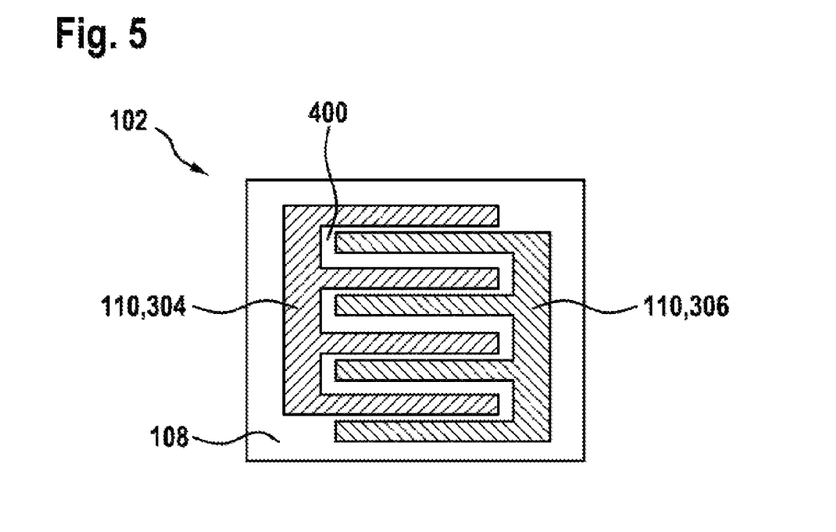
FIG. 5 a representation of a deposited counter-electrode device for a capacitive structure according to an exemplary embodiment.

FIG. 5 shows a representation of a deposited counter-electrode device 110 for a capacitive structure 102 according to an exemplary embodiment. In this case a production state of the capacitive structure 102 that follows the production state shown in FIG. 4 is shown. Here, the dielectric 108 has been deposited as at least one continuous layer over the electrode device arranged on the substrate. A counter-electrode device 110 is arranged on the dielectric material 108. As shown in FIG. 3, the counter-electrode device 110 has a first partial counter-electrode 304 and a second partial counter-electrode 306 interlaced with the first partial counter-electrode 304. The gap 400 exists between the partial counter-electrodes 304, 306. The gap 400 is formed by a width of a rectangularly meandering intermediate region, by means of which the partial counter-electrodes 304, 306 are insulated from one another.

The FIGS. 2 to 5 show possible exemplary embodiments of the one capacitive structure 102. This essentially consists of two electrodes 106, 110, between which a thin film 108 with voltage-dependent permittivity is located. In different exemplary embodiments of the approach presented here, the thin film 108 can comprise lead-zirconate-titanate (PZT), barium (strontium) titanate (B(S)T), as well as more complex oxides or strained thin films. In addition, other dielectric thin films, such as $LaNiO_3$, $SiO_2$, $Si_3N_4$, can be added in the stack 102, for example, to achieve a passivation or to match the lattice constants of the electrode material 106, 110 and dielectric 108 to each other. The upper and lower electrode 106, 110 in the figures, onto which the charge to be measured is applied or that are used for measuring the capacitance, can each consist of a contiguous area or be electrically isolated from each other, for example, similar to an interdigital electrode, wherein again, suitable insulation layers can be used between the electrodes 300, 302, 304, 306. They can also be deposited in the form of a metallic conductive material, such as Pt, Al, polysilicon, or else implanted in the substrate material 200.

FIG. 6 shows an illustration of a relationship 124 between an electrical voltage U and an electrical capacitance C on a capacitive structure in accordance with an exemplary embodiment. The relationship 124 is plotted as a curve in a graph 600, with the voltage U plotted on the abscissa and the capacitance C on the ordinate. The curve 600 represents a typical voltage-dependent permittivity or capacitance of a ferroelectric material used as a dielectric in the capacitive structure. For example, if a first measurement is made at operating point A, a charge-induced voltage change ΔU leads to a capacitance change ΔC.

In other words, FIG. 6 shows the principle of the charge measurement schematically. The capacitance C, respectively, the impedance of the structure, is measured at a particular operating point A, thus at a particular applied voltage U. If additional charge is then applied to the electrodes, or the electrodes isolated therefrom, this generates a superimposed electric field, and thus acts like a voltage offset ΔU. As a result of the voltage-dependent permittivity of dielectric material, this is directly followed by a capacitance change ΔC or impedance change, which can be read off very accurately by means of known methods from MEMS technology, such as by applying an alternating voltage and detecting the reactive current or, in particular, integrating the capacitance into a resonant oscillating circuit and detecting the detuning of the resonance frequency. The corresponding connections of the structure to the associated readout electronics are not shown in the FIGS. 2 to 5.

In addition to the direct measurement of the capacitance change ΔC or the impedance change at a fixed operating point A, it is conceivable to perform frequency sweeps or bias voltage sweeps and to evaluate the effect of the charge change or the frequency shift on the overall capacitance-frequency curve 600 or the capacitance-voltage curve 600.

For measuring small currents, the electrodes can be charged at a specific refresh rate and discharged again in between. From the measured charge and the refresh rate the current is then obtained directly by taking into account the charging characteristics of the capacitor.

Figure 7:
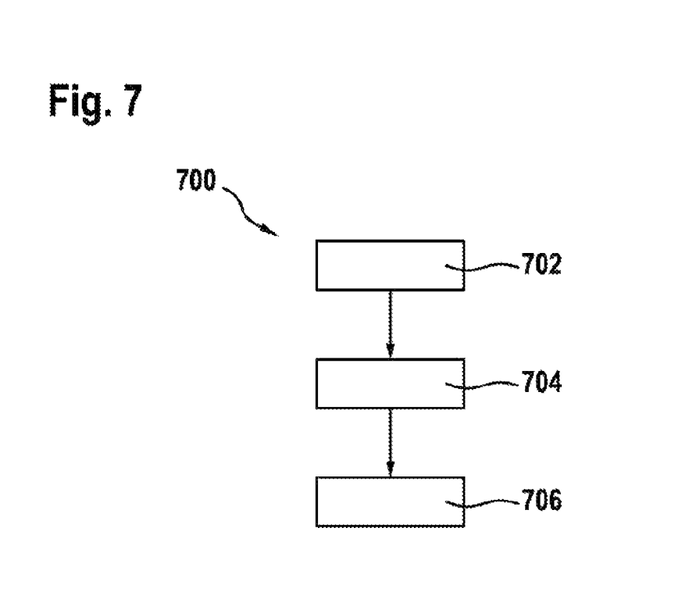
FIG. 7 a flow diagram of a method for determining an amount of charge in accordance with an exemplary embodiment.

FIG. 7 shows a flow diagram of a method 700 for determining an amount of charge Q in accordance with an exemplary embodiment. The method 700 can be implemented, for example, on a system as shown in FIG. 1. The method 700 is implemented on a capacitive structure in accordance with the approach presented here. The method 700 has an adjusting step 702, an application step 704 and a detecting step 706. In the adjusting step 702, an electrical reference potential is adjusted between the electrode device and the counter-electrode device of the capacitive structure, in order to set a reference capacitance. In the application step 704, an electrical potential resulting from the amount of charge is applied in addition to the reference potential, in order to obtain a resulting capacitance. In the detection step 706, a capacitance change is detected between the reference capacitance and the resulting capacitance, in order to determine the amount of charge. The detection step 706 is implemented in accordance with one exemplary embodiment parallel to the application step 704, to measure the capacitance with and without additional charge, and additionally or alternatively during the charge transfer.

Figure 8:
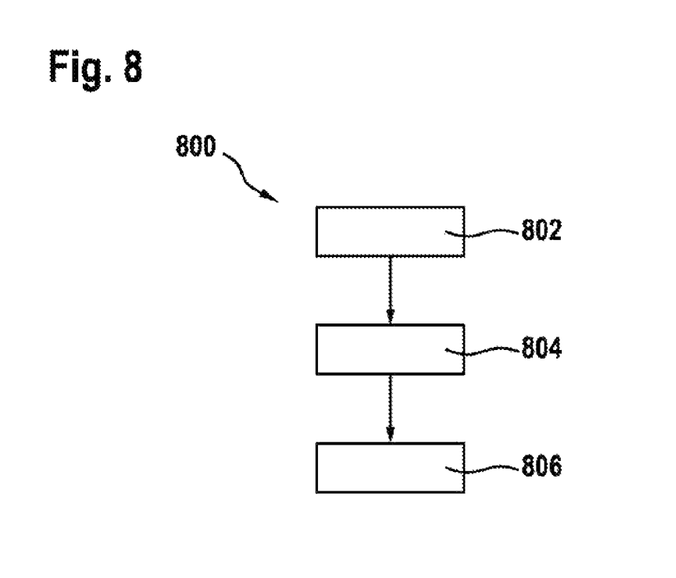
FIG. 8 a flow chart of a method for producing a capacitive structure in accordance with an exemplary embodiment.

FIG. 8 shows a flow diagram of a method 800 for producing a capacitive structure in accordance with an exemplary embodiment. The method has a step 802 of providing an electrode device and a counter-electrode device, a step 804 of providing a dielectric material with a voltage-dependent permittivity, as well as a step of arranging (806) the dielectric material adjacent to the electrode device and the counter-electrode device. The steps 802, 804, 806 can be implemented in any order, and even at the same time.

In accordance with an exemplary embodiment, the electrode device is provided in the provision step 802. For example, the electrode device as shown in FIG. 4 can be deposited on a substrate. In step 804, the dielectric material having the voltage-dependent permittivity is deposited on the electrode device. The step 802 is then executed again, in order to deposit the counter-electrode device on the dielectric, as shown in FIG. 5. The arrangement step 806 in this case is executed parallel to the provision steps 802, 804 in order to join the provided elements to the capacitive structure.

If an exemplary embodiment comprises an "and/or" association between a first and a second feature, this should be read as meaning that the exemplary embodiment according to one embodiment has both the first feature and the second feature, and in accordance with another exemplary embodiment, it has either only the first or only the second feature.

The invention claimed is:

1. A method for determining an amount of charge using a capacitive structure which has an electrode device, a dielectric material with a voltage-dependent permittivity, and a counter-electrode device, the method comprising:
   adjusting an electrical reference potential between the electrode device and the counter-electrode device in order to adjust a reference capacitance;
   applying an electrical potential resulting from the amount of charge in addition to the reference potential in order to obtain a resulting capacitance; and
   detecting a change in capacitance between the reference capacitance and the resulting capacitance in order to determine the amount of charge,
   wherein the step of detecting is implemented parallel to the step of applying, and
   wherein the amount of charge is determined using the detected change in capacitance and a relation between the electrical potential and an electrical capacitance on the capacitive structure.

2. The method as claimed in claim 1, wherein:
   adjusting the electrical reference potential further comprises adjusting the electrical reference potential between an electrode of the electrode device and a counter electrode of the counter-electrode device, and
   applying the electrical potential further comprises applying the electrical potential between the electrode and the counter-electrode.

3. The method as claimed in claim 1, wherein:
   adjusting the electrical reference potential further comprises adjusting the electrical reference potential between a partial electrode of the electrode device and a partial counter-electrode of the counter-electrode device, and
   applying the electrical potential further comprises applying the electric potential between a further partial electrode of the electrode device and a partial counter electrode of the counter-electrode.

4. A device for determining an amount of charge comprising:
   a capacitive structure including an electrode device, a dielectric material with a voltage-dependent permittivity, and a counter-electrode device,
   wherein the capacitive structure is configured to execute a method for determining an amount of charge comprising
   adjusting an electrical reference potential between the electrode device and the counter-electrode device in order to adjust a reference capacitance,
   applying an electrical potential resulting from the amount of charge in addition to the reference potential in order to obtain a resulting capacitance, and
   detecting a change in capacitance between the reference capacitance and the resulting capacitance in order to determine the amount of charge,
   wherein the step of detecting is implemented parallel to the step of applying, and wherein the amount of charge is determined using the detected change in capacitance and a relation between the electrical potential and an electrical capacitance on the capacitive structure.

5. The device of claim 4, wherein a computer program is configured to execute the method.

6. The device of claim 5, further comprising:
a computer-readable storage medium, on which the computer program is stored.

7. The capacitive structure as claimed in claim 4, wherein the dielectric material is arranged between the electrode device and the counter-electrode device.

8. The capacitive structure as claimed in claim 4, wherein the electrode device has an electrode and/or the counter-electrode device has a counter-electrode.

9. The capacitive structure as claimed in claim 4, wherein:
the electrode device comprises a partial electrode and a further partial electrode,
the first partial electrode and the additional partial electrode are arranged adjacent to each other and electrically isolated from each other, and/or the counter-electrode device comprises a partial counter-electrode and a further partial counter-electrode, and
the partial counter-electrode and the additional partial counter-electrode are arranged adjacent to each other and electrically isolated from each other.

10. The capacitive structure as claimed in claim 4, wherein the dielectric material is a lead-zirconate titanate (PZT) or a barium (strontium) titanate (B(S)T).

11. The capacitive structure as claimed in claim 4, wherein the dielectric material is configured as a strained thin film.

12. The capacitive structure as claimed in claim 11, wherein at least one further thin film is arranged between the electrode device and the counter-electrode device.

13. The capacitive structure as claimed in claim 4, wherein the dielectric material is arranged adjacent to the electrode device and the counter-electrode device.

* * * * *